United States Patent [19]

Driscoll et al.

[11] 4,134,085

[45] Jan. 9, 1979

[54] NARROW DEVIATION VOLTAGE CONTROLLED CRYSTAL OSCILLATOR FOR MOBILE RADIO

[76] Inventors: Michael M. Driscoll, 4823 West Parkway, Baltimore, Md. 21229; Rafi Arakelian, Khayam Ave., Lashgari St., Noubahar Junction, #62, Shiraz, Iran

[21] Appl. No.: 801,991

[22] Filed: May 31, 1977

[51] Int. Cl.² .......................... H03B 5/36; H03C 3/22; H03C 3/28

[52] U.S. Cl. .................................. 331/116 R; 331/76; 331/77; 331/177 V; 332/16 T; 332/26; 332/30 V

[58] Field of Search .................. 331/116 R, 158, 159, 331/164, 74, 76, 77, 177 V; 332/16 T, 26, 30 V

[56] References Cited

U.S. PATENT DOCUMENTS

| | | | |
|---|---|---|---|
| 3,382,462 | 5/1968 | Davis | 331/116 R X |
| 3,528,032 | 9/1970 | Tahmisian, Jr. et al. | 331/116 R |
| 3,581,240 | 5/1971 | Enderby | 331/116 R X |
| 3,631,364 | 12/1971 | Schilb et al. | 332/30 V X |

OTHER PUBLICATIONS

Driscoll, IEEE Transactions on Instrumentation and Measurement, vol. IM-23, No. 2, Jun. 1974, pp. 131-140.

Primary Examiner—Siegfried H. Grimm
Attorney, Agent, or Firm—Cushman, Darby & Cushman

[57] ABSTRACT

A linear sensitivity voltage controlled crystal oscillator of the type including a resonator coupled to a negative resistance generator. The resonator comprises a crystal connected in series with a voltage variable capacitance device. The response of the resonator is linearized by the addition of an inductance across the voltage variable capacitance device. A resistor is shunted across the crystal to prevent oscillation at spurious resonances of the resonator.

15 Claims, 12 Drawing Figures

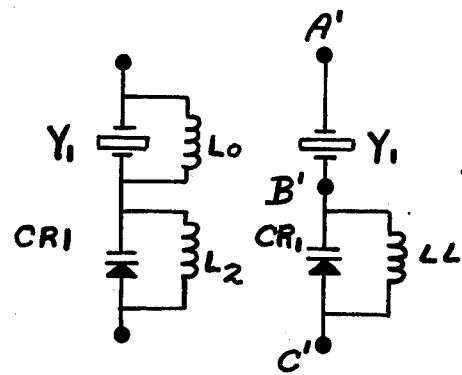
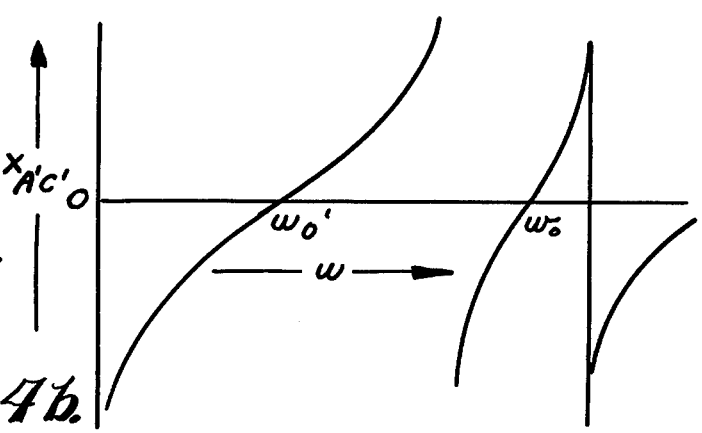
Fig.4a. Fig.4b. Fig.4c.
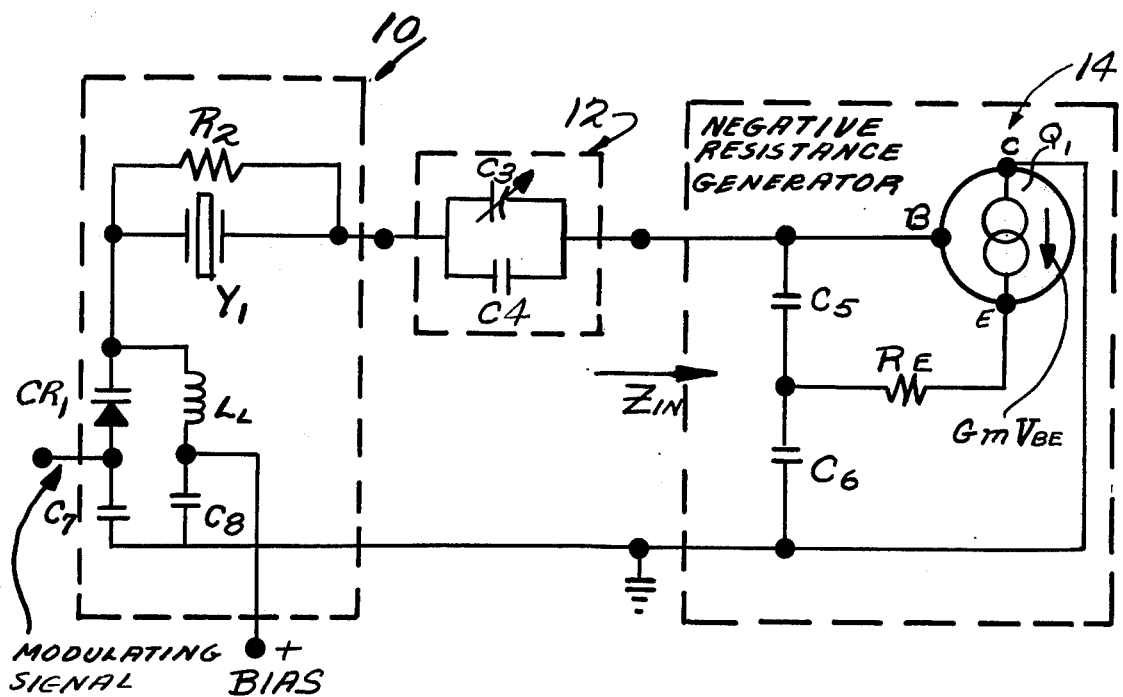
Fig.5.

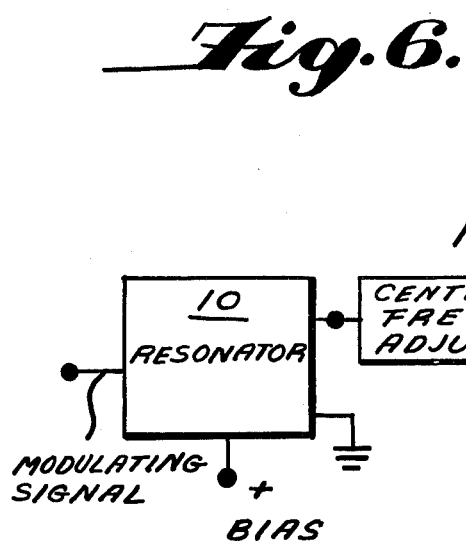
Fig. 6.
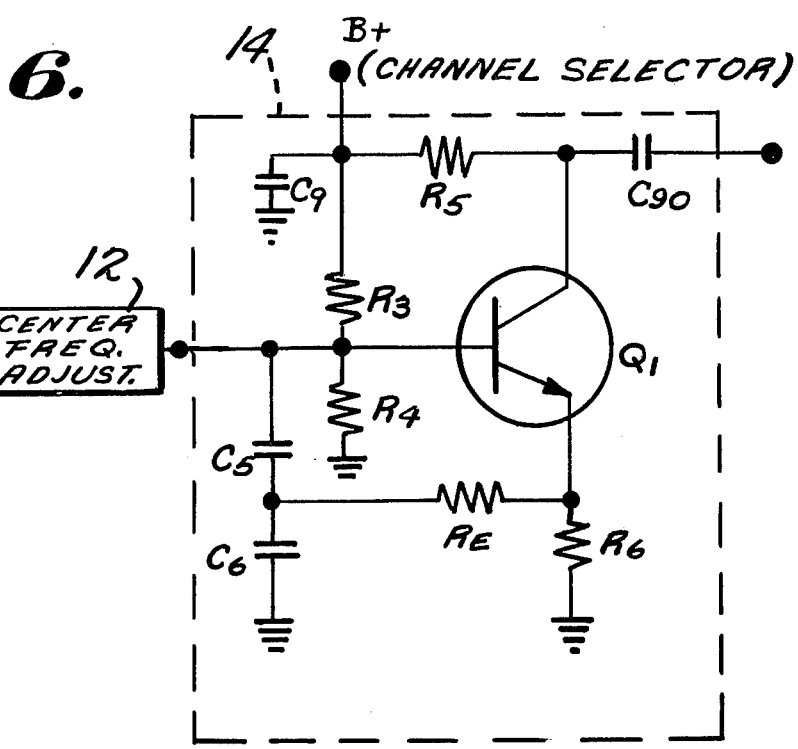
Fig. 7.
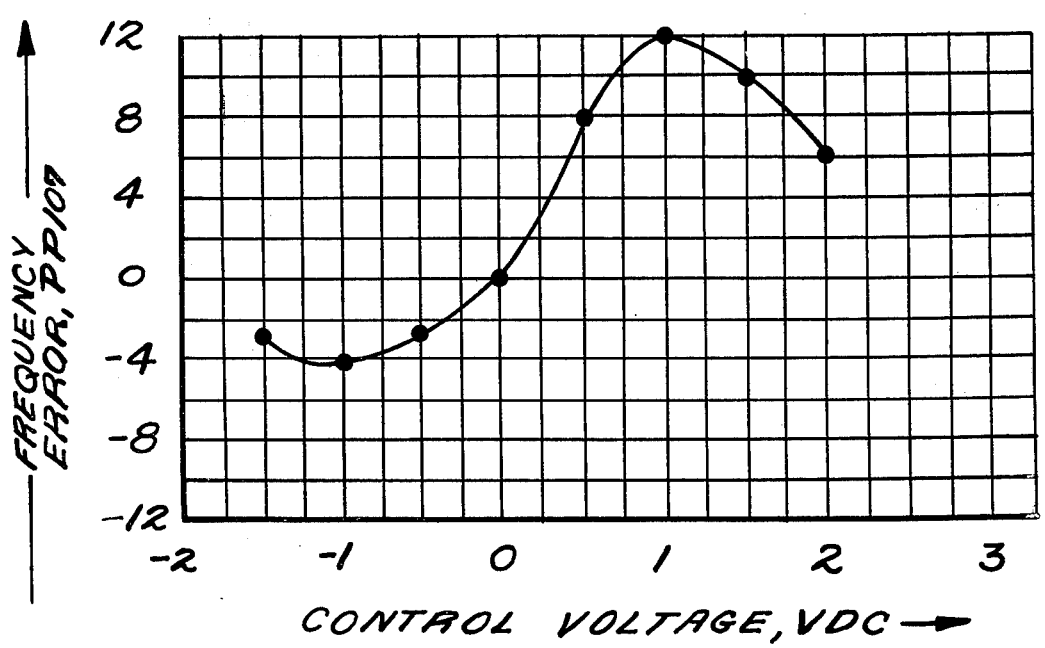

NARROW DEVIATION VOLTAGE CONTROLLED CRYSTAL OSCILLATOR FOR MOBILE RADIO

Voltage controlled crystal oscillators (VCXO) are well known in the art. Such VCXOs generally comprise a voltage tunable resonator comprising a crystal unit and a voltage variable capacitance coupled across a sustaining stage such as an appropriately biased transistor amplifier.

Direct frequency modulation can be achieved utilizing a VCXO by applying a modulating signal across the voltage variable capacitance device to change the resonant frequency of the resonator.

Direct FM modulation has been utilized in narrow band FM communications systems, such as mobile radios. FCC regulations presently allocate to mobile radio communications the range of frequencies from 132 to 174 MHz in the upper VHF band. A maximum ± 5KHz deviation from nominal channel carrier frequencies is allowed (corresponding to ±29 to ±38 parts per million frequency change). Industry standards, such as EIA Specification RS152-B, "Minimum Specification for Land Mobile FM or PM Transmitters", February, 1970, require that distortion in the FM modulator be less than 10% and that the carrier frequency stability be ±0.0005% over a temperature range of −30 to +60° C. Such stringent carrier stability and maximum deviation requirements necessitate temperature compensation of the quartz crystal unit. Generally, temperature compensation of the quartz resonator is achieved by applying, as a bias voltage to the voltage variable capacitance device, a synthesized temperature dependent voltage waveform. The synthesized bias waveform compensates for frequency drift in accordance with the oscillator third order temperature characteristic, over a predetermined temperature range and generally compensates for temperature frequency drifts on the order of ±10 to ±15 parts per million. The voltage waveform is generally provided by a thermistor voltage divider or bridge, typically designed by a reiterative computer program.

In a mobile radio communications system utilizing direct frequency modulation, a modulating signal (typically, a voice signal from a microphone) is applied to an audio processing circuit. The audio processor generally includes an amplifier, a pre-emphasis circuit, a limiter circuit and a low-pass filter. The limiter circuit insures that the signal applied to the modulator does not exceed a predetermined maximum magnitude, determined in accordance with the sensitivity of the modulator, to prevent frequency deviations in excess of the prescribed 5KHz maximum. The low-pass filter blocks spurious frequency components generated by the limiting process. The signal from the audio processor is applied to the voltage variable capacitance device, in addition to the temperature compensated bias voltage, to control the resonant frequency of the resonator and thereby provide a frequency modulated output signal. The frequency modulated signal is then applied to frequency multiplying and power amplifying stages for transmission.

A problem arises, however, with direct frequency modulators in that there is a high degree of non-linearity in the modulator sensitivity, that is, the change in resonant frequency in response to change in applied voltage. Because of the non-linearity, direct frequency modulation has often been disregarded in favor of frequency modulation simulated by a plurality of cascaded phase modulators with appropriate de-emphasis circuitry.

The present invention is directed to a narrow deviation VCXO having a linear tuning characteristic for use as a direct frequency modulator.

A detailed description of the preferred embodiment will hereinafter be described in conjunction with the accompanying drawings, wherein like designations refer to like elements and wherein:

FIG. 4(a) is a schematic diagram of a linear composite resonator;

FIG. 4(b) is a schematic of an equivalent circuit for a linear composite resonator;

FIG. 4(c) shows the reactance versus frequency characteristic of the composite resonator of FIG. 4(b);

FIG. 5 is a generalized block schematic of a VCXO in accordance with the present invention;

FIG. 6 is a schematic diagram of one embodiment of a VCXO in accordance with the present invention;

FIG. 7 is a graph illustrating the linearity of the circuit of FIG. 6; and

Figure 1A:
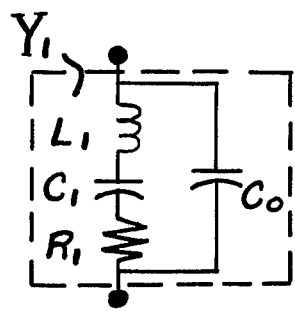
FIG. 1(a) shows an equivalent circuit for the crystal.
Figure 1B:
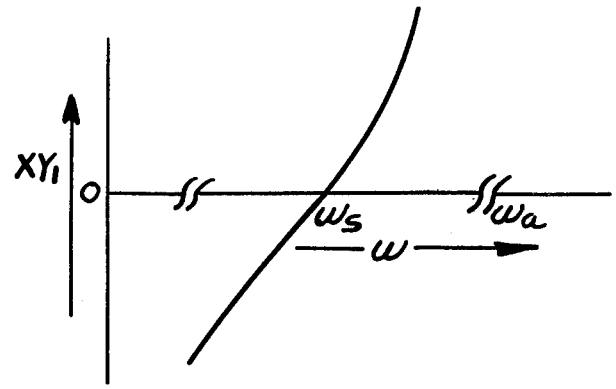
FIG. 1(b) shows the reactance versus frequency characteristic of the crystal.

As illustrated in FIG. 1(a), a quartz crystal is electrically equivalent to a series combination of an inductor $L_1$, capacitor $C_1$ and resistor $R_1$, the combination connected in parallel with a static or shunt capacitance $C_0$. The crystal thus exhibits a series-resonant frequency $\omega_s$, at which the inductive and capacitive reactances effectively cancel, equal to $(1)/\sqrt{L_1 C_1}$. The crystal also maintains "parallel" resonant frequency $\omega_a$, where the reactance is effectively infinite. The crystal anti-resonance is determined by the series capacitance-inductance in parallel with the shunt capacitance $C_0$. For widely used fundamental AT-cut crystals, the shunt capacitance is approximately 250 times the series capacitance. Accordingly, the anti-resonant frequency is equal to approximately 1.002 times the series-resonant frequency.

Figure 2:
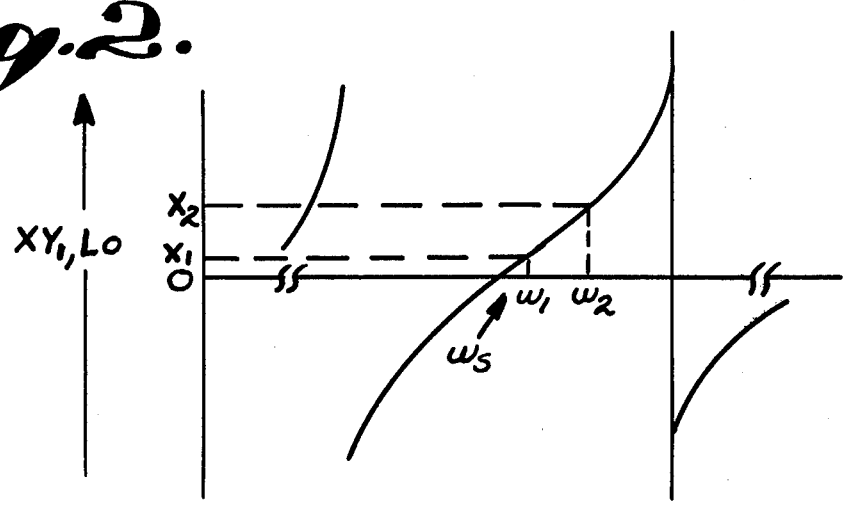
FIG. 2 shows the reactance versus frequency characteristics of such unit.

A nearly linear reactance characteristic for the crystal-inductor combination in the vicinity of the series resonant frequency $\omega_s$ can be provided by adding a shunt inductance across a crystal to effectively tune out the crystal unit static capacitance. The reactance characteristic of such a crystal-inductor combination is shown in FIG. 2. The added shunt inductance $L_0$ is chosen equal to:

$$L_0 = 1/[\omega_s^2 C_0] \qquad (1)$$

The slope $K_1$ of the reactance characteristic in the vicinity of the series resonant frequency $\omega_s$ may be expressed mathematically:

$$K_1 = \Delta X/\Delta\omega = 2L_1 \text{ ohm} \cdot \text{sec/radian} \qquad (2)$$

Similarly, a voltage variable capacitive reactance having a nearly linear reactance-voltage characteristic can be provided by adding a shunt inductor across an abrupt junction varactor diode. The reactance-voltage characteristic of commonly used varactor diodes are highly non-linear. The abrupt junction varactor diode maintains a somewhat more linear reactance-voltage characteristic. An abrupt junction varactor diode with a contact potential $\phi$ and having applied an voltage V exhibits a capacitance $C_v$ which may be mathematically expressed as:

$$C_v = K(V + \phi)^{-\delta} \qquad (3)$$

Such capacitance is generally specified in terms of the varactor 4-volt applied voltage capacitance $C_{-4}$:

$$C_v = C_{-4}((4 + \phi)/(V + \phi))^{\delta} \qquad (4)$$

Contact potential $\phi$ is generally on the order of 0.6 volts and, for an abrupt junction varactor diode, $\delta$ is approximately equal to 0.5.

The reactance X of the parallel diode-inductor combination may thus be expressed as:

$$X = \omega L_2/(\omega^2 L_2 K (V + \phi)^{-\delta} - 1) \qquad (5)$$

Figure 3:
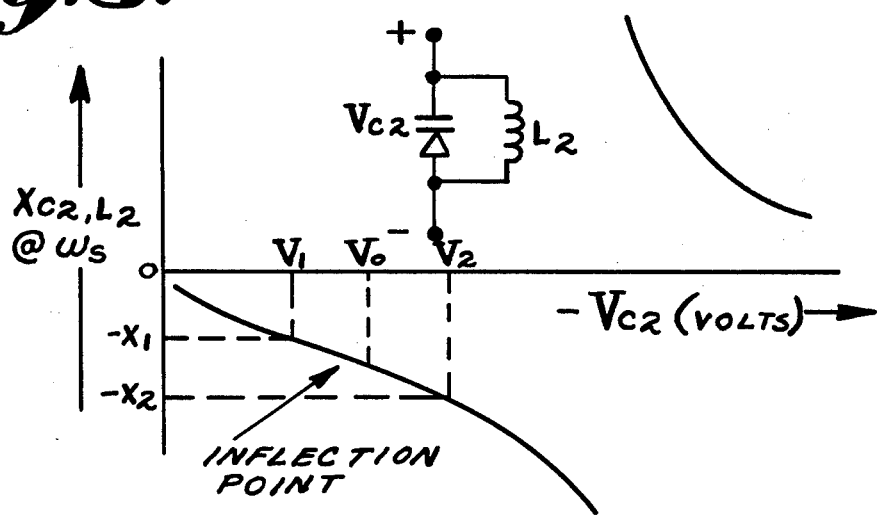
FIG. 3 shows the reactance versus voltage characteristic of a linearized abrupt junction device.

As shown in FIG. 3, an inflection point occurs in the reactance characteristic of the parallel diode-inductor combination. The value of inductance $L_2$ necessary to provide such inflection point at a predetermined voltage $V_0$ may be determined by differentiation of equation (5) to be:

$$L_2 = (1/\omega^2 C_{-4})((1+\delta)/(1-\delta))$$
$$(V_o+\phi)/(4+\phi))^{\delta} \qquad (6)$$

where $\delta = 0.5$ $$L_2 = (3/\omega^2 C_{-4})((V_0 + \phi)/(4 + \phi))^{1/2} \qquad (7)$$

The slope of $K_2$ of the reactance characteristic at the inflection point is therefore:

$$K_2 = -(1/\omega C_{-4})((1+\delta)^2/4\delta)((V_0 + \phi)^{\delta-1}/(4+\phi)^{\delta}) \qquad (8)$$

where $\delta = 0.5$ $$K_2 = -9/8 (1/\omega C_{-4})((V_0 + \phi)(4 + \phi))^{-1/2} \qquad (9)$$

A composite resonator having a nearly linear frequency-voltage characteristic over predetermined frequency and voltage ranges can thus be provided by connecting a crystal-inductor unit in series with an abrupt junction varactor-inductor combination. The composite resonator exhibits a resonant frequency which varies nearly linearly over a range of frequencies from $\omega_1$ to $\omega_2$ (above $\omega_s$) as the voltage applied to the varactor is varied from $V_1$ to $V_2$. Such a composite resonator is shown in FIG. 4a, and reactance versus frequency characteristic is shown in FIG. 4c. The sensitivity $K_0$ (change in frequency per volt) of the composite resonator is equal to the ratio of the slope of the reactance-voltage characteristic of the varactorinductor combination, and the frequency-reactance characteristic of the crystal inductor combinations. That is:

$$K_0 = K_2/K_1 \qquad (10)$$

Substituting equations 2 and 7 into equation 10, the value of 4-volt varactor capacitance required to provide a predetermined sensitivity $K_0$ with a crystal having a series inductance $L_1$ may be determined to be:

$$C_{-4} = (-9/16K_0)(1/\omega_s L_1)((V_0 + \phi)(4 + \phi))^{-1/2} \qquad (11)$$

Thus, a resonator using a given crystal can be designed to have a substantially linear tuning sensitivity $K_0$ with equations 11, 7 and 1.

Circuit inductances are generally the least stable of the resonator components and, further, are not readily miniaturized. Accordingly, it is desirable to combine inductors $L_0$ and $L_2$, substituting therefor a single inductor $L_L$, shunted across the varactor (as shown in FIG. 4b). The value of inductor $L_L$ is equal to the parallel combination of $L_0$ and $L_2$. That is:

$$L_L = (L_0 L_2)/(L_0 + L_2) \qquad (12)$$

The resonant frequency-voltage characteristic of the composite resonator is substantially unchanged by the use of a single linearization inductor $L_L$ so long as the overall resonant frequency does not approach the antiresonance of the crystal unit.

With reference to FIG. 4c, it is seen that the resonator exhibits desired resonance at a frequency $\omega_o$ slightly above the series resonance $\omega_s$ of the crystal. However, a spurious resonance at a lower frequency $\omega_o'$ is also exhibited. For composite resonators designed to tune over the 0.01% range, spurious resonance is calculated to occur in the vicinity of 0.7 $\omega_s$.

A wide deviation VCXO utilizing a varactor diode and linearization inductor is described in U.S. Pat. No. 3,571,754 issued Mar. 23, 1971 to M. Driscoll and D. Healey III. Attempts have been made to convert such wide band VCXOs into a narrow band VCXO suitable for mobile radio applications. Such a VCXO, however, couples the crystal in parallel with a parallel combination of varactor and inductor and, therefore, operates at the anti-resonant frequency of the network. Center frequency adjustment is provided by a further variable capacitance coupled across the crystal and a trap circuit is utilized in the sustaining stage to alter the sustaining stage amplifier feed-forward gain and phase, and thereby prevent oscillation at the spurious resonance $\omega_o'$ of the composite resonator.

Such a VCXO is not suitable for use in the mobile radio. Adjustment of center frequency by changing an additional parallel capacitance not only affects the center frequency but simultaneously affects the linearity of the oscillator. In practice, proper tuning of the capacitance of the center frequency results in substantial error in linearity. Further, the trap circuit components introduce temperature and vibration instability into the oscillator. In addition, the above-described circuit does not readily permit direct connection of a plurality of VCXOs to a common output node as generally required in multi-channel mobile radio applications.

The present invention provides a VCXO which avoids the above-mentioned problems. Briefly, a parallel varactor-inductor combination is serially coupled to the crystal (as shown in FIG. 4(b) to allow adjustment of the center frequency without substantial change in linearity of response. A resistance shunted across the crystal is utilized to prevent oscillations at spurious resonator resonance $\omega_o'$, as will be explained later, thereby eliminating the need for a trap circuit in the VCXO. Further, a negative resistance generator is utilized which provides for coupling of a plurality of such VCXOs to a common input and output port.

A VCXO in accordance with the present invention is shown in the generalized form in FIG. 5. A modulating signal and temperature compensation and bias voltage are applied to a composite resonator 10 of the series type shown in FIG. 4b. Resonator 10 includes an abrupt junction varactor diode $CR_1$, a linearization inductor $L_L$, a crystal $Y_1$, and a shunt resistor $R_2$. Varactor $CR_1$ and inductor $L_L$ are connected to a common node and to ground potential, respectively, through bypass capacitors $C_7$ and $C_8$. The modulating signal and temperature compensation and bias signal are respectively applied at the junctures between varactor $CR_1$ and capacitor $C_7$ and inductor $L_L$ and capacitor $C_8$.

Resistor $R_2$ is shunted across crystal $Y_1$ and one common node of the crystal-resistor combination is connected to the common node of varactor $CR_1$ and inductor $L_L$. The output of resonator 10 is taken from the other common node of the crystal-resistor.

Resonator 10 is connected through a variable reactance 12 to a negative resistance generator 14. Variable reactance 12 suitably comprises capacitors $C_3$ and $C_4$ and provides for center frequency adjustment as will be explained.

Negative resistance generator 14 effectively comprises a resistor $R_E$ and capacitors $C_5$ and $C_6$, cooperating with a high impedance current generator having a transconductance gm, to provide an input impedance $Z_{in}$ expressed mathematically:

$$Z_{in} = -j[1/\omega C_5 + 1/\omega C_6] - [1/\omega^2/C_5 C_6(R_E + 1/gm)] \quad (13)$$

The second term of equation 13 constitutes the negative resistance portion of the input impedance. Resistor $R_E$ provides a form of local negative feedback and is preferably chosen to be at least an order of magnitude greater than (1)/gm, such that the ratio of negative resistance to composite resonator positive series resistance (called oscillator excess gain) is substantially unaffected by changes in transconductance gm. The net capacitance load on resonator 10 due to capacitors $C_3$, $C_4$, $C_5$ and $C_6$ has negligible effect on the tuning sensitivity or linearity of the resonator so long as the net reactance of the capacitors is small as compared to the static capacitance $C_0$ of crystal $Y_1$. The load capacitance shifts the oscillator operating frequency $\omega_0$ to a value slightly higher than the series resonance of resonator 10 and can be adjusted via variable reactance 12 to alter the center frequency of the VCXO. The effect of the capacitive load on resonator 10 is to change the apparent series inductance and apparent static inductance of the crystal unit. Where the net capacitive load on the resonator by capacitors $C_3$-$C_6$ is equal to $C_s$ (with variable reactance 12 taken at a predetermined nominal), the effective series inductance $L'_1$ and static capacitance $C'_0$ can be calculated as follows:

$$L'_1 = L_1(1 + (C_0/C_s))^2 \quad (14)$$

$$C'_0 = C_0 C_s/(C_0 + C_s) \quad (15)$$

Thus, if desired, the change due to the capacitive loading of the resonator can be predetermined and accounted for in the design of the composite resonator by utilizing the effective (adjusted) values $L'_1$ and $C'_0$ in the design equations. It should be noted that an inductor could be placed in series with the composite resonator to tune out the total net capacitive reactance of the sustaining stage, or to tune out the total net capactive reactance of the VCXO, to permit operation at the crystal series resonance.

As noted above, oscillation at spurious resonance $\omega'_o$ of resonator 10 is prevented by the addition of resistor $R_2$ across the crystal. Resistor $R_2$ is chosen to have a resistance many times larger than the nominal reactance of the crystal unit at the oscillator operation frequency, avoiding thereby any significant effect on resonator loss. However, at the spurious resonance, the reactance exhibited by the crystal unit is substantially equal to the static capacitance $C_0$(usually on the order of 2 to 5 pF), and $R_2$ introduces an effective composite resonator series resistance, where such series resistance is higher than the negative reactance of generator 14 at $\omega'_o$ oscillation is prevented.

Negative resistance generator 14 is additionally advantageous in that the negative resistance portion of input impedance $Z_{in}$ decreases rapidly with increasing frequency, preventing thereby oscillation at higher mode (overtone) resonances in the crystal unit. Further, the negative resistance generator 14 can be adapted to provide a substantially isolated terminal for signal extraction, in that such terminal is, in effect, a high impedance current source (as shown in FIG. 6). Thus, coupling the VCXO to a low impedance, such as a common base buffer amplifier, results in the production of an extremely small VCXO output terminal voltage. Normal oscillator operation is, therefore, unperturbed by load impedance variation. In addition, since the VCXO output impedance is high compared to, for example, a common base buffer amplifier input impedance, a plurality of oscillator outputs can be coupled to a single buffer amplifier without substantial loading effects on the activated VCXO by the non-activated oscillator modules. Coupling of plural oscillator modules will be more fully described in conjunction with FIG. 8.

As noted above, FIG. 6 shows a VCXO in accordance with the present invention utilizing a suitable transistor negative resistance generator 14. Signals from resonator 10 are applied through variable reactance 12 across capacitors $C_5$ and $C_6$ and to the base of an NPN transistor $Q_1$. Transistor $Q_1$ is suitably biased by resistors $R_3$, $R_4$, $R_5$ and $R_6$. Capacitors $C_9$ and $C_{10}$ are bypass capacitors to respectively prevent AC signals from being applied to the power supply and DC signals from reaching the output terminal.

As noted above, capacitors $C_5$ and $C_6$ and resistor $R_E$ are utilized to provide, with transistor $Q_1$, the predetermined negative resistance. Resistor $R_E$ provides, in effect, an emitter-to-base feedback and further minimizes the dependence of the negative resistance on the transistor transconductance gm. For a more detailed description of such phenomenon and the operation of such a negative resistance generator 14, reference is made to "HF and VHF Source Stabilization Incorporating Q-Multiplied Quartz Crystal Unit", M. Driscoll, IEEE Trans. on I. and M., June, 1974, Vol. IM-23, No. 2, pp. 131-140.

A VCXO in accordance with the present invention, as embodied in FIG. 6, has been constructed for operation at a frequency in the range of 12.5 MHz, with a nominal tuning sensitivity of −200 Hz/volts and ±500 Hz deviation. To compensate for the expected decrease in tuning sensitivity due to capacitors $C_3$ through $C_6$, as well as composite resonator element value tolerance, the VCXO was designed to exhibit a $-250$ Hz/volt sensitivity and a potentiometer (to be discussed in conjunction with FIG. 8) was provided for final adjustment of sensitivity. A crystal unit having an 8.5 mH motional (series) inductance at 12 MHz and motional capacitance of 0.019 pF, was utilized. The values of the respective components are listed in Table I.

TABLE I

| ELEMENT | VALUE | ELEMENT | VALUE |
|---|---|---|---|
| $CR_1$ | 100 pF at $-4v$ | $C_3$ | 15-60 pF |
| $L_1$ | 4.7 $\mu$H | $C_4$ | 82 pF |
| $R_E$ | 22 $\Omega$ | $C_5$ | 220 pF |
| $R_2$ | 33K $\Omega$ | $C_6$ | 220 pF |
| $R_3$ | 10K $\Omega$ | $C_7$ | 0.001$\mu$F |
| $R_4$ | 10K $\Omega$ | $C_8$ | 0.01$\mu$F |
| $R_5$ | 100K $\Omega$ | $C_9$ | 0.01$\mu$F |
| $R_6$ | 620K $\Omega$ | $C_{10}$ | 0.01$\mu$F |
| $Q_1$ | 2N2222 | | |

For the values for capacitors $C_3$-$C_6$ given in Table I, the total equivalent capacitance in series with the crystal is equal to 54 pF. Such capacitive loading effectively increases the apparent inductance of the crystal unit as presented by $CR_1$, L1 by approximately 20%, thereby decreasing the tuning sensitivity by 19% from 250 Hz per volt to 210 Hz per volt. The change in apparent static capacitance $C_0$ is equal to approximately 0.5 pF and may be neglected.

The oscillator operates from a 9-volt DC regulated supply and nominal diode bias of varactor $CR_1$ ($V_0$) is equal to 5.6 volts. The current through transistor $Q_1$ is on the order of 5 milliamps DC and the negative resistance can be calculated to be approximately $-93$ ohms. The equivalent net positive series resistance exhibited by resonator 10, largely the result of losses in the crystal unit and resistor $R_2$ can be approximated to be on the order of 30 ohms. The oscillator excess gain is therefore on the order of 10 dB.

As noted above, resistor $R_2$ is shunted across the crystal to prevent oscillation at the spurious resonant frequency $\omega'_0$ of the composite resonator 10. In the case of the circuit with component values given in Table I, the maximum reactance exhibited by the crystal unit over the desired tuning range of the oscillator is approximately 500 ohms. The addition of 33,000 ohms resistor $R_2$ across the crystal introduces only about 7.5 ohms additional equivalent series resistance in the composite resonator. At the spurious resonance $\omega'_0$ (here approximately 8.5 MHz), the reactance of the crystal unit is substantially that of the crystal static capacitance (approximately j 3.7 K$\Omega$) and the equivalent series resistance due to resistor $R_2$ is on the order of 400 ohms. Since the equivalent series resistance of the resonator is much larger than the negative resistance exhibited by the sustaining stage 14, no oscillation occurs. FIG. 7 shows the tuning linearity error measured for the circuit of FIG. 6 with component values as set out in Table I. The error from linearity is on the order of 15 parts in $10^7$, that is, 2% of the tuning range.

In practice, signal distortion due to, for example, limiting in negative resistance generator 14, may necessitate filtering of the output signal from the collector of transistor $Q_1$. Further, generator 14 can be designed such that the excess gain is high (e.g. 10 dB) to provide for a small conduction angle sinusoidal output signal current rich in harmonics. A harmonic can then be extracted by the filter. It may also be desirable, as will be explained in conjunction with FIG. 8, to couple the collector of $Q_1$ to a low input impedance buffer such as a common base amplifier and filter the output thereof.

Figure 8:
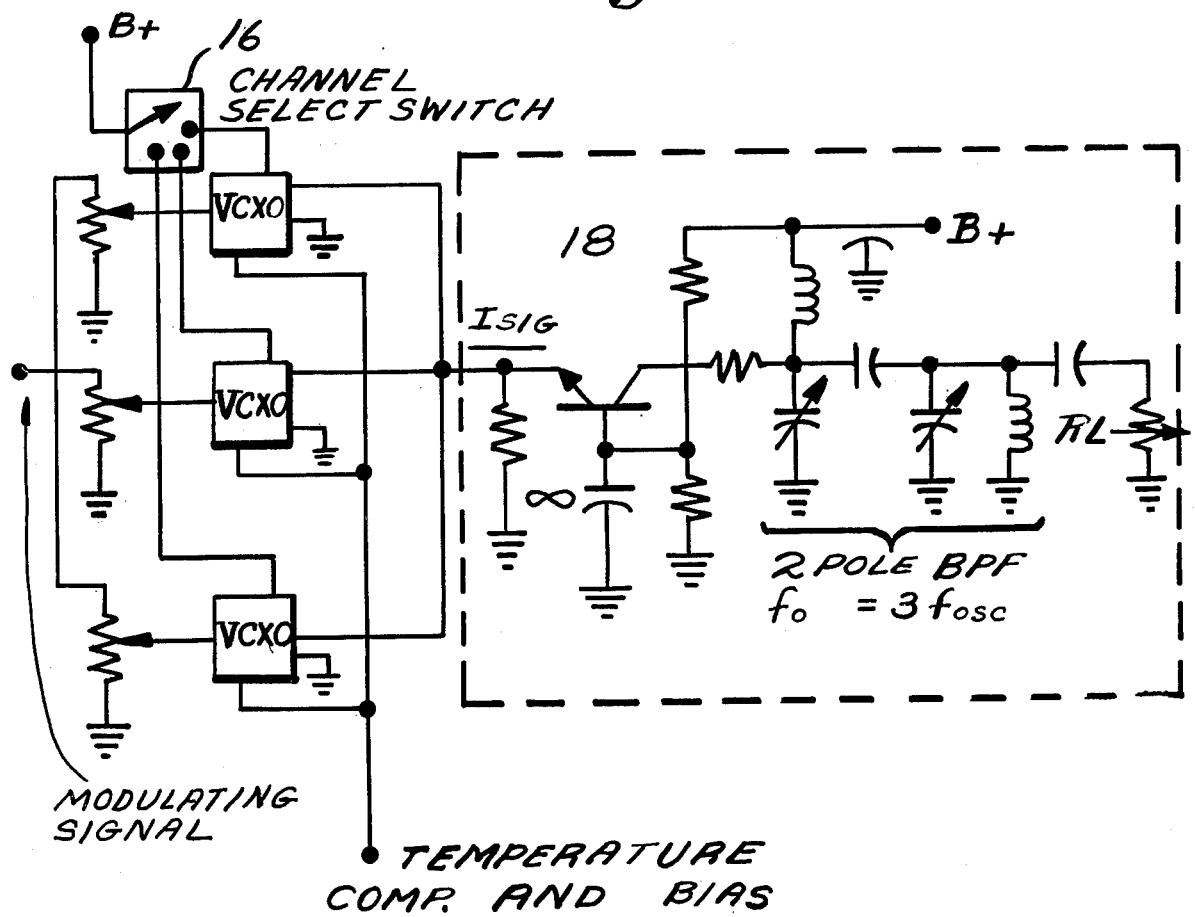
FIG. 8 is a block schematic of a system utilizing a plurality of VCXOs in accordance with the present invention.

As noted above, since a VCXO in accordance with the present invention exhibits a high output impedance, a plurality of such VCXOs can be connected to a common output port without appreciable loading effect on the active VCXO by the inactive VCXOs. Such a system, for use in the multi-channel mobile radio, is shown in FIG. 8. Each of a plurality of VCXOs in accordance with the present invention corresponds to a respective predetermined frequency channel. The desired channel is chosen by applying power only to the corresponding VCXO, as by a channel select switch 16. The modulating signal is applied to each of the VCXOs through respective potentiometers, which provide for sensitivity adjustment and equalization of sensitivity of the various channel VCXOs. A bias voltage and temperature compensation waveform, if desired, is also applied to each of the VCXOs. Signal current is extracted at the collector of negative resistance generator 14, as shown in FIG. 6, and applied to a common base buffer amplifier having a very low input impedance. The output port of the activated VCXO thus "sees" an impedance equal to the input impedance of buffer 18, and the respective output impedances of the non-activated VCXOs, all connected in parallel. Since the buffer input impedance is very much smaller than the output impedances of the VCXOs, the VCXOs have no significant loading effect on the activated VCXO. Further, since the output from the VCXO is, in effect, from a high impedance current source, the collector voltage is directly related to the impedance of the load. Accordingly, the collector voltage amplitude is very low, avoiding any significant feedback through the inter-terminal capacitances of transistor $Q_1$.

Figure 9:
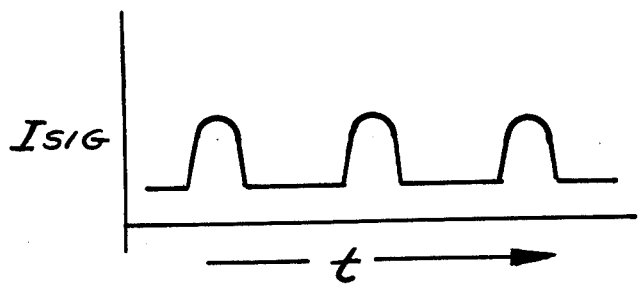
FIG. 9 shows the waveform of the output signal of the VCXOs of FIG. 8.

A collector tank circuit is provided in buffer amplifier 18 to extract power at the desired frequency. It should be noted that since such tank circuit is not in the feedback loop of the VCXO, it does not significantly affect the stability of the oscillator. Assuming, in this example, that the oscillator excess gain is made relatively large, the collector current in the negative resistance generators and, accordingly the collector signal of common base buffer amplifier 18, consists of a small conduction angle sinusoid rich in harmonic content. The signal waveform is shown in FIG. 9. The tank circuit can be tuned to, for example, the third harmonic of the current waveform such that the buffer operates as a frequency tripler. In practice, the third harmonic is extracted and subsequently multiplied by four in the transmitter for generation of the final VHF signal transmitted.

A VCXO in accordance with the present invention can also be used as a fixed tuned local oscillator by grounding the modulating signal input. In practice, the mobile radio receiver local oscillator signals are generated by applying the current waveforms from the respective channel VCXOs (with grounded modulating signal input) to a frequency tripling buffer, then further frequency multiplied by three.

It should be appreciated from the preceding description that the present invention provides a particularly advantageous, narrow deviation VCXO, particularly suited for VHF mobile radio applications. A set of simple design equations are provided for the synthesis of a near linear, voltage tunable crystal controlled composite resonator comprising a crystal unit, a varactor diode and an inductor. The inductor can be of the standard molded variety. Suppression of oscillation at the composite resonator's spurious resonance is achieved by the insertion of a single resistor across the crystal. The sustaining stage is configured to provide for connection of multiple VCXOs with common modulation input signal and output ports.

It should be further appreciated that the above description is of illustrative embodiments of the present invention and that the invention is not limited to the specific form shown. Modifications may be made in the design and arrangement of the elements without departing from the spirit of the invention as will be apparent to those skilled in the art.

What is claimed is:

1. In a voltage controlled crystal oscillator (VCXO) for providing an output signal of a frequency in accordance with a control voltage applied thereto, said VCXO being of the type including a composite resonator coupled to a negative resistance generator, said composite resonator comprising a crystal, in series connection with a parallel combination of a voltage variable capacitance device, responsive to a control voltage applied thereto, and an inductance;
    said crystal having a unit static capacitance associated therewith and said voltage variable capacitance having a predetermined reactance versus voltage characteristic, the improvement wherein:
    said inductance is of a predetermined value equal to the parallel combination of (a) a first inductance exhibiting a reactance complementary to the reactance of said unit static capacitance and (b) a second inductance exhibiting a reactance to provide, when in effective parallel connection across said voltage variable capacitance, an inflection point in the reactance versus voltage characteristic of the parallel combination of said second inductance and said voltage variable capacitance at a nominal midband value of said control voltage.

2. The VCXO of claim 1 further comprising a resistor shunted across said crystal, said resistor having a value much greater than the reactance of said crystal at the desired nominal VCXO operation frequency to provide at spurious resonant frequencies an equivalent resonator resistance greater than the magnitude of the negative resistance provided by said generator at said spurious resonant frequency and thereby prevent oscillation.

3. The VCXO of claim 2 further comprising:
    a variable capacitance, connected in series with said resonator, for adjusting the center frequency of said VCXO.

4. The VCXO of claim 1 further comprising:
    a variable capacitance, connected in series with said resonator, for adjusting the center frequency of said VCXO.

5. The VCXO of claim 1 wherein:
    said crystal has a motional inductance of value $L_1$, motional capacitance of value $C_1$, static capacitance of value $C_0$, and series resonant frequency $\omega_s$, said voltage variable capacitance is an abrupt junction varactor with a contact potential $\phi$ and four volt capacitance $C_{-4}$, and said inductor has a value $L_L$, where:

$$L_L = [(1/\omega_s^2 C_0)(3/\omega^2 C_{-4})((V_0 + \phi)/(4 + \phi))^{1/2}]/[(1/\omega_s^2 C_0) + (3/\omega^2 C_{-4})((V_0 + \phi)/(4 + \phi))^{1/2}] \text{ and } C_{-4} = (-9/16K_0)(1/\omega_s L_1)((V_0 + \phi)(4 + \phi))^{-1/2}$$

where $K_0$ is the sensitivity of said VCXO and $V_0$ is a bias voltage applied to said varactor and $\omega$ is the nominal frequency of operation of said VCXO.

6. The VCXO of claim 3 wherein:
    said crystal has a motional inductance of value $L_1$, motional capacitance of value $C_1$, static capacitance of value $C_0$, and series resonant frequency $\omega_s$, said voltage variable capacitance is an abrupt junction varactor with a contact potential $\phi$ and four volt capacitance $C_{-4}$, and said inductor has a value $L_L$ where:

$$L_L = [(1/\omega_s^2 C_0)(3/\omega^2 C_{-4})((V_0 + \phi)/(4 + \phi))^{\frac{1}{2}}]/[(1/\omega_s^2 C_0) + (3/\omega^2 C_{-4})((V_0 + \phi)/(4 + \phi))^{\frac{1}{2}}] \text{ and } C_{-4} = (-9/16K_0)(1/\omega_s L_1)((V_0 + \phi)(4 + \phi))^{-\frac{1}{2}}$$

wherein $K_0$ is the sensitivity of said VCXO and $V_0$ is a bias voltage applied to said varactor and $\omega$ is the nominal frequency of operation of said VCXO.

7. In a voltage controlled crystal oscillator (VCXO) of the type including a resonator coupled to a negative resistance generator, said resonator comprising a crystal, a voltage variable capacitance device, a linearization inductance, the improvement wherein:
    said variable capacitance device is coupled in series with said crystal and said inductance is effectively an inductor coupled across said variable capacitance device;
    said crystal having a motional inductance of $L_1$, motional capacitance of value $C_1$, static capacitance of value $C_0$ and series resonant frequency $\omega_s$, said voltage variable capacitance being an abrupt junction varactor with a contact potential $\phi$ and four volt capacitance $C_{-4}$, and said inductor has a value of $L_L$ where:

$$L_L = [(1/\omega_s^2 C_0)(3/\omega^2 C_{-4})((V_0 + \phi)/(4 + \phi))^{\frac{1}{2}}]/[(1/\omega_s^2 C_0) + (3/\omega^2 C_{-4})((V_0 + \phi)/(4 + \phi))^{\frac{1}{2}}] \text{ and } C_{-4} = (-9/16K_0)(1/\omega_s L_1)((V_0 + \phi)(4 + \phi))^{-\frac{1}{2}}$$

wherein $K_0$ is the sensitivity of said VCXO and $V_0$ is a bias voltage applied to said varactor and $\omega$ is the nominal frequency of operation of said VCXO.

8. The VCXO of claim 1 wherein said negative resistance generator provides a resistance the magnitude of which increases with increasing frequency.

9. The VCXO of claim 7 wherein said negative resistance generator provides a resistance the magnitude of which increases with increasing frequency.

10. In the VCXO of claim 1 the further improvement wherein:
    said negative resistance generator comprises:
    a voltage dependent current source, having first, second and third terminals, for generating a current at said third terminal having a magnitude in accordance with the voltage between said first and second terminals and having a transconductance gm;
    first and second capacitances $C_1$ and $C_2$ respectively connected in series and coupled between said first and third terminals; and
    a feedback resistance $R_E$ coupled between said second terminal and the juncture between said first and second capacitances;
    the input impedance of said negative resistance generator appearing across said capacitors and being in accordance with:

$$-j[1/\omega C_1 + 1/\omega C_2] - [1/\omega^2 C_1 C_2 (R_E + (1/gm))]$$

where ω is the frequency of signals from said resonator.

11. The VCXO of claim 10 wherein $R_E$ is much larger than 1/gm.

12. In the VCXO of claim 7, the further improvement wherein:

said negative resistance generator comprises:

a voltage dependent current source, having first, second and third terminals, for generating a current at said third terminal having a magnitude in accordance with the voltage between said first and second terminals and having a transconductance gm;

first and second capacitances $C_1$ and $C_2$ respectively connected in series and coupled between said first and third terminals; and a feedback resistance $R_E$ coupled between said second terminal and the juncture between said first and second capacitances;

the input impedance of said negative resistance generator appearing across said capacitors and being in accordance with:

$$-j[1/\omega C_1 + 1/\omega C_2] - [1/\omega^2 C_1 C_2 (R_E + (1/gm))]$$

where ω is the frequency of signals from said resonator.

13. The VCXO of claim 12 wherein $R_E$ is much larger than 1/gm.

14. A voltage controlled crystal oscillator (VCXO) comprising:

a resonator including a crystal coupled to a voltage variable capacitance device, and a linearization inductance, said resonator having an effective series resistance; p1 a negative resistance generator, responsive to signals from said resonator, for sustaining oscillation when the magnitude of said negative resistance is greater than the effective series resistance of said resonator;

and means, cooperating with said resonator, for selectively increasing said effective series resistance to a value greater than said negative resistance magnitude at frequencies outside of a predetermined range of frequencies, to prevent thereby oscillation at spurious resonant frequencies of said resonator.

15. The VCXO of claim 14 wherein said negative resistance generator has a relatively high output impedance, and the effective series resistance of said resonator is much less than said negative resistance magnitude in the operational frequency range of said VCXO: further comprising a relatively low input impedance buffer amplifier, receptive of signals from said negative resistance generator, including filter means for extracting a predetermined harmonic of said negative resistance generator output signal.

* * * * *